United States Patent
Bando et al.

(10) Patent No.: US 9,007,145 B2
(45) Date of Patent: Apr. 14, 2015

(54) HIGH-FREQUENCY SIGNAL BALANCING MULTIPLEXER

(75) Inventors: Tomoya Bando, Nagaokakyo (JP);
Kiyoshi Yamaguchi, Nagaokakyo (JP);
Yasunori Nabetani, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 518 days.

(21) Appl. No.: 13/118,632

(22) Filed: May 31, 2011

(65) Prior Publication Data
US 2011/0298560 A1  Dec. 8, 2011

(30) Foreign Application Priority Data

Jun. 7, 2010  (JP) ................................ 2010-129855

(51) Int. Cl.
*H03H 7/46* (2006.01)
*H03H 1/00* (2006.01)

(52) U.S. Cl.
CPC ....... *H03H 7/463* (2013.01); *H03H 2001/0085* (2013.01)

(58) Field of Classification Search
CPC .......... H03H 2001/0085; H03H 7/463; H03H 333/25; H03H 333/132
USPC ................................... 333/132, 25
See application file for complete search history.

(56) References Cited

U.S. PATENT DOCUMENTS

| | | |
|---|---|---|
| 2006/0181370 A1 | 8/2006 | Lee et al. |
| 2007/0296505 A1 * | 12/2007 | Oka et al. ..................... 330/302 |
| 2008/0001186 A1 * | 1/2008 | Shastri et al. .................. 257/277 |
| 2009/0093270 A1 * | 4/2009 | Block et al. .................. 455/552.1 |
| 2010/0091824 A1 * | 4/2010 | Afsahi .......................... 375/219 |

(Continued)

FOREIGN PATENT DOCUMENTS

| | | |
|---|---|---|
| CN | 1767406 A | 5/2006 |
| CN | 101502011 A | 8/2009 |
| CN | 101617436 A | 12/2009 |

(Continued)

OTHER PUBLICATIONS

L. K. Yeung, K. Wu, A Dual-Band Coupled-Line Balun Filter, Nov. 2007, IEEE Transactions on Microwave Theory and Techniques, pp. 2406-2411.*

(Continued)

*Primary Examiner* — Stephen E Jones
*Assistant Examiner* — Scott S Outten
(74) *Attorney, Agent, or Firm* — Keating & Bennett, LLP

(57) ABSTRACT

A high-frequency module enabling sufficient attenuation over a wide frequency range outside of a passband includes a triplexer including a combination of an LPF, a BPF, and HPFs arranged to demultiplex a signal input from a common terminal into a first communication signal, a second communication signal, and a third communication signal in different frequency bands, and to output the first, second, and third communication signals from individual terminals. The individual terminals of the triplexer are connected to respective baluns. The baluns are configured such that the respective passbands of the baluns overlap the respective frequency bands of the communication signals and the respective passbands of the triplexer, and the attenuation of the baluns at the attenuation poles of the triplexer is −3 dB or greater. This configuration provides high attenuation in the rebound bands of the attenuation poles.

9 Claims, 8 Drawing Sheets

(56) References Cited

U.S. PATENT DOCUMENTS

| | | |
|---|---|---|
| 2010/0117763 A1 | 5/2010 | Suwa et al. |
| 2010/0123528 A1 | 5/2010 | Okada et al. |

FOREIGN PATENT DOCUMENTS

| | | |
|---|---|---|
| JP | 58-069106 A | 4/1983 |
| JP | 2001-267128 A | 9/2001 |
| JP | 2002-339507 A | 11/2002 |
| JP | 2003-008385 A | 1/2003 |
| JP | 2005-333485 A | 12/2005 |
| JP | 2006-229917 A | 8/2006 |
| JP | 2006-332980 A | 12/2006 |
| JP | 2010-119094 A | 5/2010 |

OTHER PUBLICATIONS

Sergiy Sakhnenko, Denys Orlenko, Kostyantyn Markov, Andriy Yatsenko, Borys Vorotnikov, Georgiy Sevskiy, Patric Heide, Martin Vossiek, Low Profile LTCC Balanced Filter Based on a Lumped Elements Balun for WiMAX Applications, 2008 IEEE MTT-S International Microwave Symposium Digest, Jun. 2008.*

Official Communication issued in corresponding Japanese Patent Application No. 2010-129855, mailed on Jun. 26, 2012.

* cited by examiner

HIGH-FREQUENCY SIGNAL BALANCING MULTIPLEXER

BACKGROUND OF THE INVENTION

1. Field of the Invention

The present invention relates to a high-frequency module that transmits and receives high-frequency signals with a plurality of frequencies including a single antenna.

2. Description of the Related Art

With increasing performance and decreasing sizes of radio frequency communication apparatuses, such as mobile phones, a circuit for transmitting and receiving communication signals having high frequencies in different frequency bands by sharing a single antenna is required. Various types of triplexers for transmitting and receiving three different types of communication signal have been proposed as such a circuit.

For example, in the triplexer described in Japanese Unexamined Patent Application Publication No. 2006-332980, a low pass filter, a band pass filter, and a high pass filter are connected in parallel to common terminals, where the passbands of the respective filters are different from one another. Among three types of communication signals, the low pass filter allows communication signals in the lowest frequency band to pass therethrough, the high pass filter allows communication signals in the highest frequency band to pass therethrough, and the band pass filter allows communication signals in an intermediate frequency band to pass therethrough. Each filter attenuates communication signals in frequency bands other than its own frequency band.

When communication signals in a plurality of frequency bands are transmitted and received, particularly when the frequency bands of the communication signals are close to one another, not only transmission characteristics of a passband, but also attenuation characteristics in bands other than the passband need to be improved in each filter in order to allow only desired communication signals to pass. One of the methods of improving the attenuation characteristics is to set an attenuation pole using a resonance of an inductor and a capacitor near a passband. The use of this method allows attenuation characteristics near the passband to be improved as illustrated in FIG. 3 of Japanese Unexamined Patent Application Publication No. 2006-332980.

However, as shown in FIG. 3 of Japanese Unexamined Patent Application Publication No. 2006-332980, in the method of providing an attenuation pole, a low attenuation frequency band, i.e., a rebound band due to an attenuation pole, is generated in a frequency range which is farther from the passband than the attenuation pole. When such a frequency band with low attenuation outside of the passband overlaps the frequency band of another communication signal, this communication signal, which is supposed to be attenuated, is allowed to pass.

SUMMARY OF THE INVENTION

To overcome the problems described above, preferred embodiments of the present invention provide a high-frequency module that provides sufficient attenuation over wide frequency ranges outside of a passband.

According to a preferred embodiment of the present invention, a high-frequency module preferably includes a frequency selector arranged on an unbalanced side that allows a predetermined frequency band of a communication signal to pass therethrough, the unbalanced side frequency selector including at least one filter circuit, and a balun unit arranged to perform balanced to unbalanced conversion, the balun unit being connected to a first input-output terminal of the frequency selector on the unbalanced side. The filter circuit of the frequency selector preferably has an attenuation pole in proximity of the predetermined frequency band of the communication signal. In the balun unit, a passband of the balun unit preferably includes the predetermined frequency band of the communication signal, and attenuation for the communication signal in a frequency range on a side opposite to the predetermined frequency band of the communication signal with respect to the attenuation pole increases as a frequency decreases from a frequency of the attenuation pole.

With this configuration, in a frequency range with low attenuation generated on a side opposite to the passband of the filter circuit with respect to the attenuation pole in proximity of the passband, i.e., in a rebound band resulting from the above-described attenuation pole, attenuation of the balun unit is increased. Thus, in the high-frequency switch module, attenuation in the rebound band resulting from the attenuation pole is increased. Thereby, a wide frequency range having high attenuation outside of the passband is obtained. In addition, by utilizing the characteristics of the balun unit as described above, an additional filter is not required for the attenuation in the rebound band.

In the high-frequency module of a preferred embodiment of the present invention, in the balun unit, attenuation at the attenuation pole is preferably increased to about −3 dB, for example, relative to attenuation in a frequency band of the communication signal.

With this configuration, a specific example of the attenuation characteristics of the balun unit outside of a passband is provided. In this manner, preferably by making the passband of the balun unit the same or substantially the same as the passband of the filter circuit, and by making the attenuation of the balun unit at the frequency of the pole be about −3 dB, for example, of the passband, characteristics are obtained in which the attenuation gradually increases from about −3 dB when moving towards the side opposite the passband with respect to the attenuation pole. Thus, a high attenuation in the rebound band resulting from the attenuation pole described above is reliably provided.

In the high-frequency module of a preferred embodiment of the present invention, in the frequency selector, the at least one filter circuit preferably includes a plurality of filter circuits and the first input-output terminal preferably includes a plurality of first input-output terminals. The first input-output terminals are preferably individual input-output terminals for communication signals having different frequency bands, and a second input-output terminal is preferably provided as a common terminal. The balun unit preferably includes a plurality of baluns respectively arranged for the individual input-output terminals. The baluns preferably have passbands and attenuation characteristics for attenuation that corresponds to the respective input-output terminals to which the baluns are connected.

With this configuration, as a specific example of the frequency selector according to a preferred embodiment of the present invention, the case in which a plurality of the individual input-output terminals are provided for a single common terminal is described. In the case in which communication signals in a plurality of frequency bands are used in this manner, there is a problem of interference among the communication signals. However, as described above, since high attenuation outside of the respective passbands corresponding to the individual input-output terminals is provided over wide frequency ranges, such interference is effectively prevented.

In the high-frequency module of a preferred embodiment of the present invention, the frequency selector is preferably a triplexer that performs demultiplexing for three communication signals having different frequency bands input from the common terminal.

With this configuration, a triplexer is described as a specific example of the frequency selector according to a preferred embodiment of the present invention.

In the high-frequency module of a preferred embodiment of the present invention, circuit components of the triplexer preferably include inner layer electrode patterns provided on a plurality of stacked dielectric layers and/or circuit components mounted on a top surface of the plurality of stacked dielectric layers. A first balun corresponding to a first communication signal having the highest frequency band among the three types of communication signal, a second balun corresponding to a second communication signal having the lowest frequency band among the three types of communication signal, and a third balun corresponding to a third communication signal having an intermediate frequency band that is between the frequency band of the first communication signal and the frequency band of the second communication signal preferably include the inner layer electrode patterns. The inner layer electrode pattern of the first balun and the inner layer electrode pattern of the second balun are preferably at least partially provided on different layers of the plurality of stacked dielectric layers.

With this configuration, as a specific example of the high-frequency module according to a preferred embodiment of the present invention including the triplexer described above, a high-frequency module including a plurality of stacked dielectric layers is described. By not providing the baluns for specific communication signals entirely on the same layer, coupling among the baluns for specific communication signals is prevented.

In the high-frequency module of a preferred embodiment of the present invention, the inner electrode pattern of the third balun is preferably arranged between the inner electrode pattern of the first balun and the inner electrode pattern of the second balun, on the same layer of the plurality of stacked dielectric layers.

With this configuration, since the first and second baluns are arranged with the third baluns therebetween, coupling between the first and second baluns is more effectively prevented. As a result, even when the frequency of the communication signal of the first balun and the frequency of the communication signal of the second balun have a relationship in which one is a multiple of the other, i.e., even when the frequency of the harmonics of one of the two communication signals may be the frequency of the other, demultiplexing is reliably performed, and thus, unfavorable influences, such as interference, are effectively prevented.

In the high-frequency module of a preferred embodiment of the present invention, the inner electrode pattern of the first balun and the inner electrode pattern of the second balun preferably respectively have substantially spiral shapes, and the substantially spiral shapes have winding directions that are opposite to each other.

With this configuration, coupling between the first and second baluns is more effectively prevented.

In the high-frequency module of a preferred embodiment of the present invention, each of the first, second, and third baluns preferably includes an unbalanced side line having a length of about ½ of a wavelength of the corresponding communication signal and two balanced side lines having a length of about ¼ of the wavelength of the corresponding communication signal, for example, and the characteristics of each of the first, second, and third baluns are preferably set for the corresponding attenuation pole that appears in a frequency range lower than the corresponding passband of the frequency selector.

With this configuration, the first, second, and third baluns are preferably distributed constant baluns. The use of such distributed constant baluns advantageously enables a steep increase in attenuation outside of the passband which cannot be obtained by using lumped constant baluns, for example. Thereby, the attenuation for the rebound band in proximity of the attenuation pole is more reliably increased.

With distributed constant baluns, a passband appears on the higher frequency side of the set passband in a frequency band which includes frequencies of the center passband multiplied by an odd number. However, by applying the balun characteristics only to the lower frequency side outside of the passband, high attenuation is effectively provided over a wide frequency range outside of the passband.

In the high-frequency module of a preferred embodiment of the present invention, the frequency band of the first communication signal is preferably a 2 GHz band, for example, and the frequency band of the second communication signal is preferably a 5 GHz band, for example.

With this configuration, specific frequency bands of the first and second communication signals transmitted by the high-frequency module are described. In this case, preferably, the frequency band of the second communication signal is a frequency band including the second harmonic of the first communication signal, and the frequency band of the first communication signal is a frequency band including the ½ harmonic of the second communication signal. However, with the configuration described above, the first and second communication signals are reliably separated and interference is reliably prevented.

According to various preferred embodiments of the present invention, sufficient attenuation is obtained in a rebound band that results from an attenuation pole outside of the passband of a filter circuit. As a result, a high-frequency module having an outstanding demultiplexing capability based on transmission characteristics, attenuation characteristics, and other relevant characteristics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
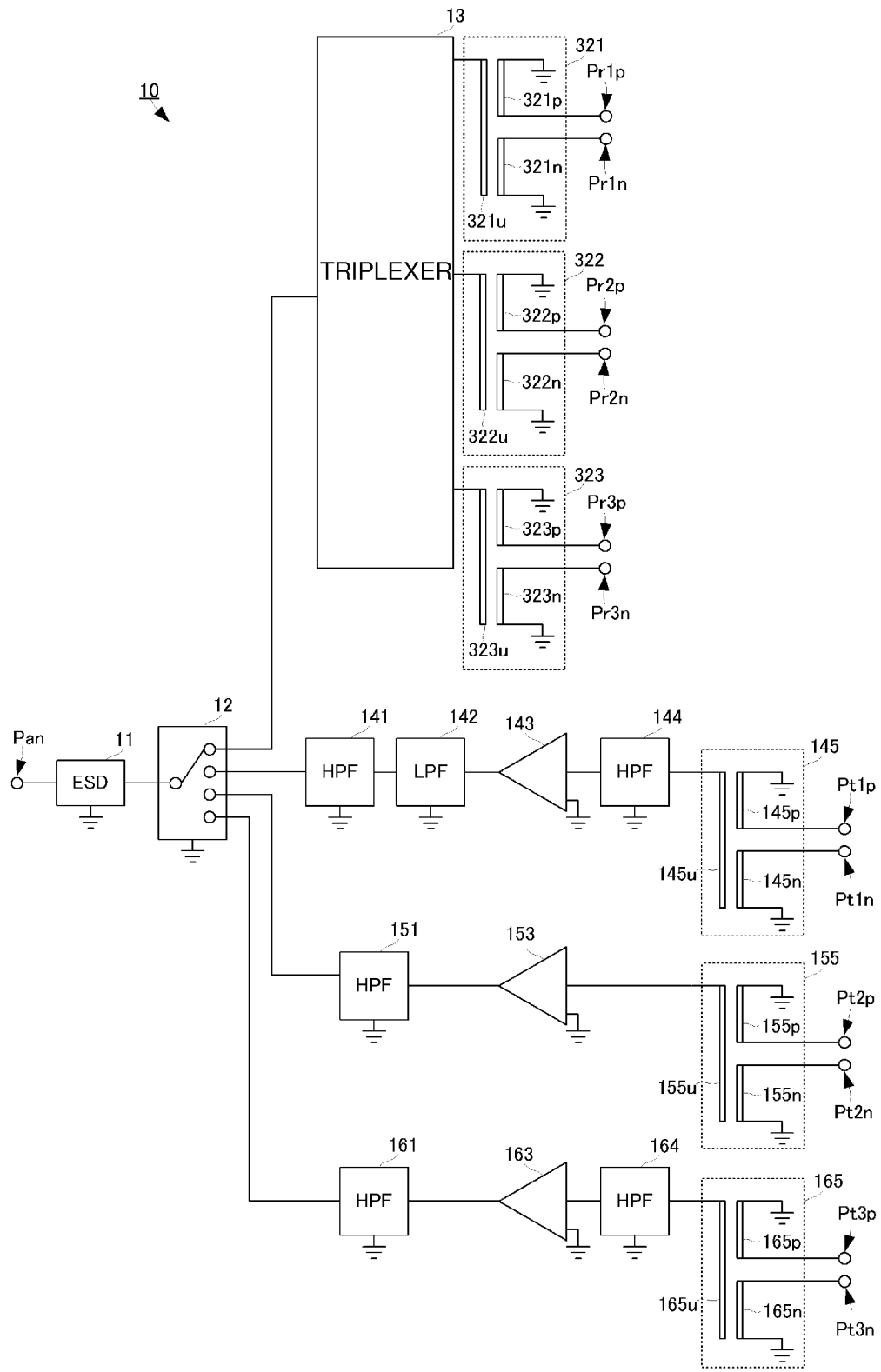
FIG. 1 is a circuit block diagram of a communication module including a high-frequency module according to a preferred embodiment of the present invention.
Figure 2:
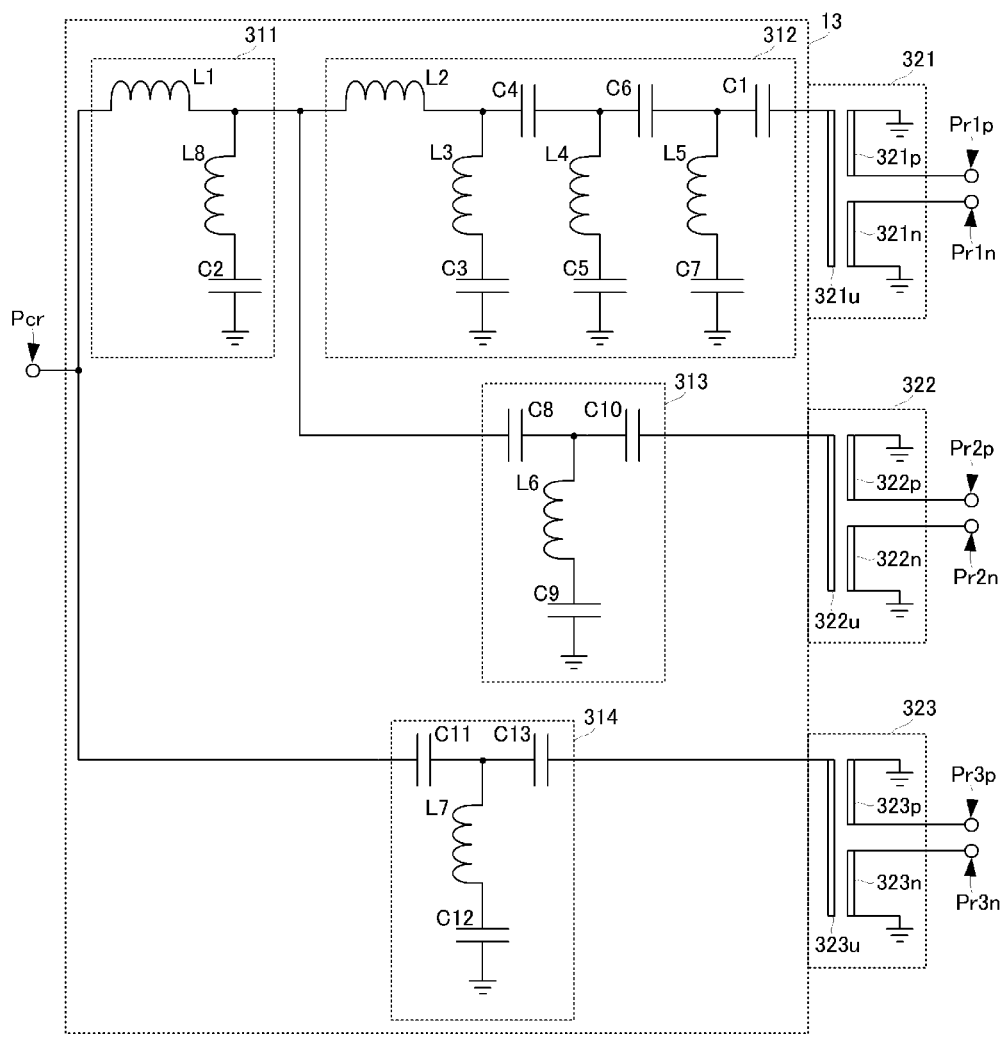
FIG. 2 is an equivalent circuit diagram of the high-frequency module according to a preferred embodiment of the present invention.

A high-frequency module according to a preferred embodiment of the present invention will be described with reference to the drawings. FIG. 1 is a block diagram illustrating the configuration of a communication module including the high-frequency module according to the present preferred embodiment. FIG. 2 is an equivalent circuit diagram of the high-frequency module according to the present preferred embodiment.

The high-frequency module of the present preferred embodiment preferably includes a triplexer 13 that corresponds to a "frequency selector," and baluns 321, 322, and 323. The high-frequency module is preferably used as a receiver unit of a communication module 10 illustrated in FIG. 1, for example, and is an integral portion of the communication module 10 that includes a plurality of stacked dielectric layers and circuit devices mounted on the plurality of stacked dielectric layer, as will be described later.

The configuration of the communication module 10 including the high-frequency module is now described. The communication module 10 preferably includes an antenna common terminal Pan connected to an antenna. The antenna common terminal Pan is connected to one end of an electrostatic discharge (ESD) circuit 11. The other end of the ESD circuit 11 is connected to a common terminal of a switch IC 12. The switch IC 12 provides a switching function to connect the common terminal to one of four RF terminals in accordance with a control voltage (not illustrated). The first RF terminal of the switch IC 12 is preferably connected to a common terminal (Pcr in FIG. 2) of the triplexer 13, which defines a receiver circuit. The second, third, and fourth RF terminals of the switch IC 12 are preferably respectively connected to transmitter circuits to transmit communication signals in different frequency bands.

The second RF terminal is preferably connected to the output end of a transmitter amplifier 143 through a high pass filter (HPF) 141 and a low pass filter (LPF) 142. The input end of the transmitter amplifier 143 is preferably connected to balanced input terminals Pt1p and Pt1n through an HPF 144 and a balun 145. Note that since the structures of transmitter side baluns 145, 155, and 165 are substantially the same as those of receiver side baluns described later except for the respective line lengths, a detailed description thereof is omitted. These circuit components connected to the second RF terminal are preferably configured so as to have a passband including a transmission frequency band of the first transmission signal in a 2 GHz band, for example, and the frequency bands of the second and third communication signals are included in the attenuation bands.

The third RF terminal is connected to the output end of a transmitter amplifier 153 through an HPF 151. The input end of the transmitter amplifier 153 is connected to balanced input terminals Pt2p and Pt2n through a balun 155. These circuit components connected to the third RF terminal are preferably configured so as to have a passband including a transmission frequency band of the third transmission signal in a 3 GHz band, for example, and the frequency bands of the first and second communication signals are included in the attenuation bands.

The fourth RF terminal is connected to the output end of a transmitter amplifier 163 through an HPF 161. The input end of the transmitter amplifier 163 is connected to balanced input terminals Pt3p and Pt3n through an HPF 164 and a balun 165. These circuit components connected to the fourth RF terminal are preferably configured so as to have a passband including a transmission frequency band of the second transmission signal in a 5 GHz band, for example, and the frequency bands of the other first and third communication signals are included in the attenuation bands.

The transmitter circuit of the communication module 10 is preferably configured as described above. Preferably, this transmitter circuit is an unbalanced circuit, and is connected to the respective balanced input terminals Pt1p and Pt1n, balanced input terminals Pt2p and Pt2n, and balanced input terminals Pt3p and Pt3n through the baluns 145, 155, and 165. Thus, by connecting, in a prior stage, currently widely used balanced input-output ICs to the communication module, the first, second, and third communication signals generated by the respective ICs can be amplified, subjected to filtering processing, and transmitted through the antenna.

The triplexer 13 connected to the first RF terminal of the switch IC 12 preferably has the configuration illustrated in FIG. 2.

One end of an LPF 311 and one end of an HPF 314 are connected to a common terminal Pcr of the triplexer 13.

The other end of the LPF 311 is connected to one end of a band pass filter (BPF) 312 and one end of an HPF 313. The other end of the BPF 312 is connected to a balun 321, and the balun 321 is connected to balanced output terminals Pr1p and Pr1n. The other end of the HPF 313 is connected to a balun 322, and the balun 322 is connected to balanced output terminals Pr2p and Pr2n. The other end of the HPF 314 is connected to a balun 323, and the balun 323 is connected to balanced output terminals Pr3p and Pr3n.

Referring to FIG. 2, the specific circuit configuration of the triplexer 13 will now be described.

The LPF 311 preferably includes an inductor L1, one end of which is connected to the common terminal Pcr. The other end of the inductor L1 is connected to one end of the BPF 312 and is connected to the ground through a series circuit including an inductor L8 and a capacitor C2. As a result of this configuration, the LPF 311 preferably has low-pass transmission characteristics (attenuation characteristics), in which the reception frequency bands, e.g., in a 2 GHz band and a 3 GHz band, of the first communication signal and the third communication signal are included in the passband and the reception frequency band, e.g., a 5 GHz band, of the second communication signal is included in the attenuation band.

The BPF 312 preferably includes an inductor L2, a capacitor C4, a capacitor C6, and a capacitor C1 that are connected in series between the LPF 311 and the balun 321, starting from the LPF 311 side. One end of the inductor L2 is connected to the other end of the LPF 311, i.e., the other end of the inductor L1, and the other end is connected to one end of the capacitor C4. The connection node between the inductor L2 and the capacitor C4 is connected to the ground through a series circuit of an inductor L3 and a capacitor C3. The other end of the capacitor C4 is connected to one end of the capacitor C6. The connection node between the capacitor C4 and the capacitor C6 is connected to the ground through a series circuit of an inductor L4 and a capacitor C5. The other end of the capacitor C6 is connected to one end of the capacitor C1. The connection node between the capacitor C6 and the capacitor C1 is connected the ground through a series circuit of an inductor L5 and a capacitor C7. As a result of this configuration, the BPF 312 preferably has band-pass transmission characteristics (attenuation characteristics) in which the reception frequency band, e.g., a 2 GHz band, of the first communication signal is included in the passband and the reception frequency band, e.g., a 3 GHz band, of the third communication signal is included in the attenuation bands.

The HPF 313 preferably includes a capacitor C8 and a capacitor C10 that are connected in series between the LPF 311 and the balun 322. The connection node between the capacitor C8 and the capacitor C10 is connected to the ground through a series circuit including an inductor L6 and a capacitor C9. As a result of this configuration, the HPF 313 preferably has high-pass transmission characteristics (attenuation characteristics) in which the reception frequency band, e.g., a 3 GHz band, of the third communication signal is included in the passband and the reception frequency band, e.g., a 2 GHz band, of the first communication signal is included in the attenuation band.

The HPF 314 preferably includes capacitors C11 and C13 that are connected in series between the common terminal Pcr and the balun 323. The connection node between the capacitors C11 and C13 is connected to the ground through a series circuit of an inductor L7 and a capacitor C12. As a result of this configuration, the HPF 314 preferably has a high-pass transmission characteristics (attenuation characteristics) in which the reception frequency band. e.g., a 5 GHz band, of the second communication signal is included in the passband and the reception frequency bands, e.g., a 2 GHz band and a 3 GHz band, of the first and third communication signals are included in the attenuation band.

As a result of the configuration described above, the first communication signal, e.g., a 2 GHz band, input from the common terminal Pcr is output to the balun 321, the second communication signal, e.g., a 5 GHz band, is output to the balun 323, and the third communication signal, e.g., a 3 GHz band, is output to the balun 322.

Preferably, the baluns 321, 322, and 323 are distributed constant baluns and include inner-layer electrode patterns within a plurality of stacked dielectric layers.

The balun 321 preferably includes an unbalanced side line 321$u$ and balanced side lines 321$p$ and 321$n$. The unbalanced side line 321$u$ is preferably a line having a length of about ½ of the wavelength of the reception frequency of the first communication signal, for example. The balanced side lines 321$p$ and 321$n$ are preferably arranged to have a positional relationship with the unbalanced side line 321$u$ so as to be coupled to the unbalanced side line 321$u$ with a predetermined degree of coupling. The balanced side lines 321$p$ and 321$n$ are preferably lines having a length of about ¼ of the wavelength of the reception frequency of the first communication signal, for example. First ends of the balanced side lines 321$p$ and 321$n$ are connected to the ground, and the second ends are respectively connected to the balanced output terminals Pr1$p$ and Pr1$n$. The balanced output terminals Pr1$p$ and Pr1$n$ are preferably connected to the balanced side lines 321$p$ and 321$n$ such that the output signals have phases that are opposite to each other.

The baluns 322 and 323, the lengths of which preferably have been set in accordance with the reception frequency of the third communication signal and the reception frequency of the second communication signal as respective references, have substantially the same configuration as the balun 321.

The receiver circuit of the communication module 10 is configured as described above. Preferably, the receiver circuit is an unbalanced circuit and is connected to the respective balanced output terminals Pr1$p$ and Pr1$n$, balanced input terminals Pr2$p$ and Pr2$n$, and balanced input terminals Pr3$p$ and Pr3$n$ through the baluns 321, 322, and 323. Thus, by connecting, in a subsequent stage, currently widely used balanced input-output ICs to the communication module, processing to demodulate communication signals is performed by the balanced input-output ICs.

The receiver circuit of the communication module 10 provides improved attenuation characteristics other than a passband, as will be described below, by using only the triplexer 13 and the baluns 321, 322, and 323 that are specially configured only to set the passbands of the respective communication signals.

Figure 3:
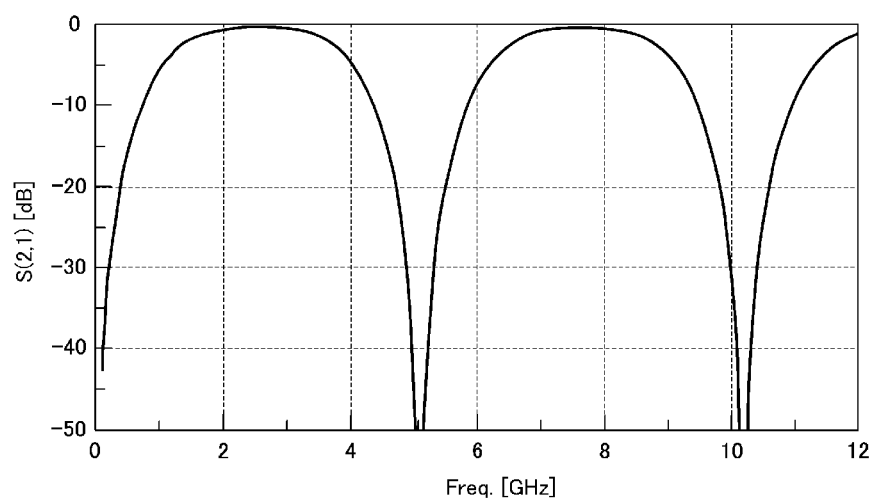
FIG. 3 is a transmission characteristics diagram of a distributed constant balun with the center frequency of a communication band of about 2.5 GHz.

The distributed constant baluns used for the above-described baluns 321, 322, and 323, have transmission characteristics as illustrated in FIG. 3. FIG. 3 is a transmission characteristics diagram of a distributed constant balun having the center frequency of about 2.5 GHz, for example. As illustrated in FIG. 3, in the distributed constant balun, the attenuation exponentially increases in the lower frequency range, with respect to the center frequency, when moving towards a frequency that is half of the center frequency. In the higher frequency range, with respect to the center frequency, the attenuation exponentially increases when moving towards a frequency which is twice the center frequency. Further, passbands also occur at frequencies which are respectively the center frequency multiplied by odd numbers.

In the present preferred embodiment, attenuation of the above-described triplexer 13 outside of the passbands for the first, second, and third communication signals is improved by utilizing the transmission characteristics of the baluns described above.

Figure 4:
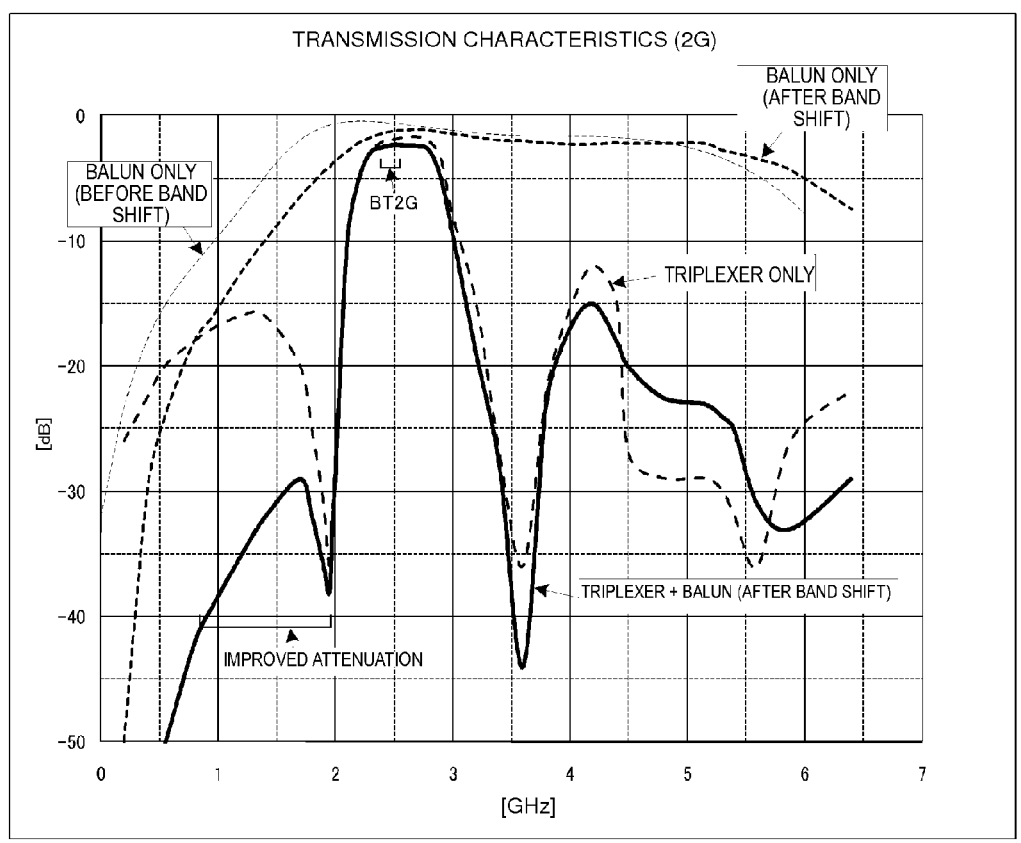
FIG. 4 is a transmission characteristics diagram of a triplexer, a balun, and a high-frequency module according to a preferred embodiment of the present invention, for a first communication signal in a 2 GHz band.
Figure 5:
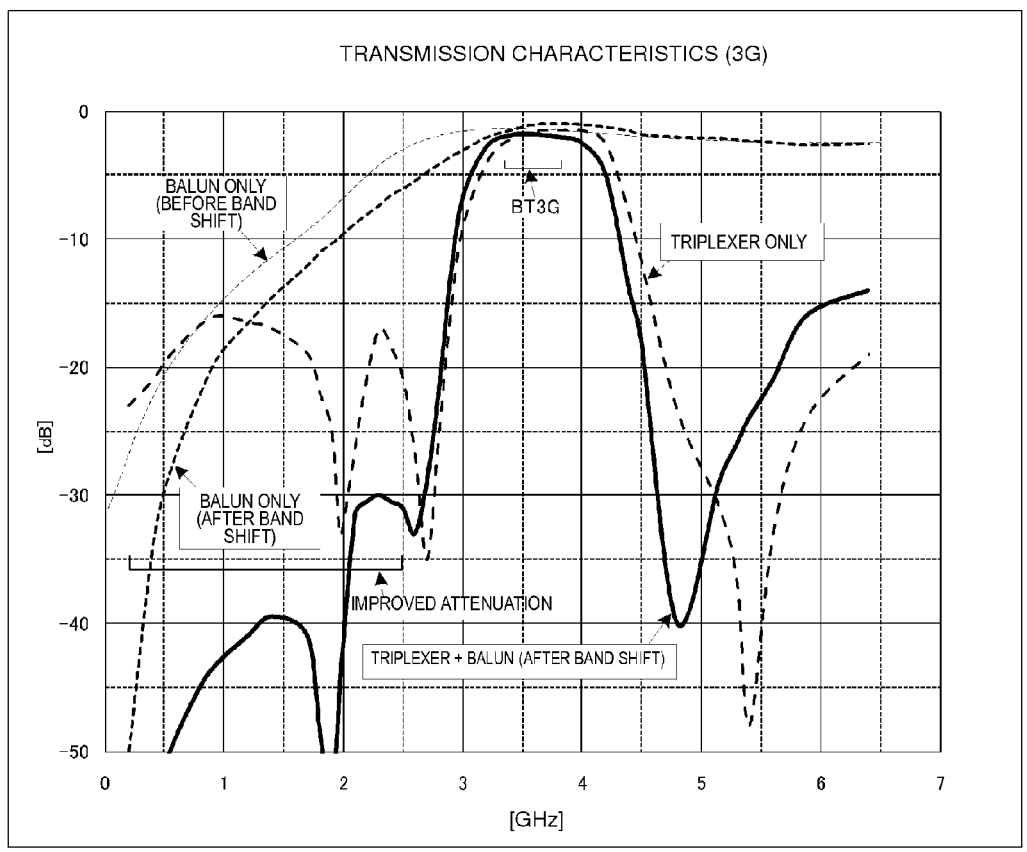
FIG. 5 is a transmission characteristics diagram of a triplexer, a balun, and a high-frequency module of a preferred embodiment of the present invention, for a third communication signal in a 3 GHz band.
Figure 6:
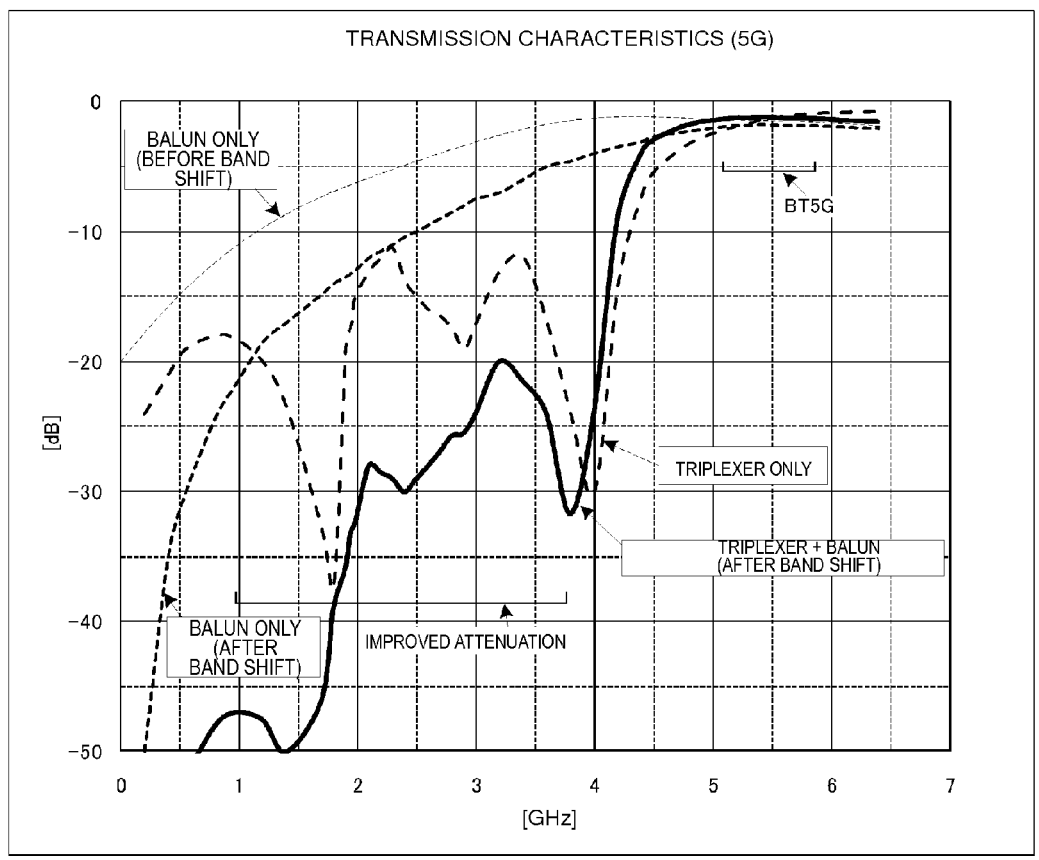
FIG. 6 is a transmission characteristics diagram of a triplexer, a balun, and a high-frequency module of a preferred embodiment of the present invention, for a second communication signal in a 5 GHz band.

FIG. 4 is a transmission characteristics diagram of the triplexer 13, the balun 321, and the high-frequency module, for the first communication signal. FIG. 5 is a transmission characteristics diagram of the triplexer 13, the balun 322, and the high-frequency module, for the third communication signal. FIG. 6 is a transmission characteristics diagram of the triplexer 13, the balun 323, and the high-frequency module, for the second communication signal.

As illustrated by the thin broken line denoted by "balun only (before band shift)" in each of FIGS. 4 to 6, the transmission characteristics of each balun have preferably been set so as to have a wide passband covering frequencies lower than the lower frequency side of the corresponding passband of the triplexer 13, and frequencies higher than the higher frequency side of the corresponding passband of the triplexer 13.

On the other hand, in the configuration according to the present preferred embodiment, the characteristics of each balun are set so as to be shifted to the higher frequency side of the "balun only (before band shift)" characteristics, as illustrated by the bold broken line in each of FIGS. 4 to 6. At this time, setting is performed such that the frequency range close to the lower limit of and within the passband of the balun overlaps the corresponding passband of the triplexer 13, and the overlapped range is substantially the same as the corresponding frequency band of communication signals.

Further, the amount of shifting of the characteristics of each balun is preferably set such that the attenuation of the balun is more than about −3 dB, for example, of the insertion loss of the passband (corresponding to the lowest attenuation) at the frequency of the attenuation pole closest to the corresponding passband of the triplexer 13. By shifting the characteristics of the baluns to the higher frequency side, the attenuation of the lower frequency side of the passbands of the triplexer 13 is increased. In this case, if the amount of shifting of the characteristics of the baluns is about −3 dB or less, for example, a sufficient improvement resulting from the shifting of the characteristics of the baluns is not obtained. The shifting of the characteristics of the baluns is achieved, for example, by decreasing the lengths of the unbalanced and balanced lines of the baluns.

As a result of the configuration described above, in the frequency range having low attenuation which is generated below an attenuation pole, the attenuation of a communication signal is much larger than about −3 dB, as illustrated in each of FIGS. 4 to 6. Thus, in the high-frequency switch module, as illustrated by the bold dotted line in each of FIGS. 4 to 6, in the attenuation band on the lower frequency side of the corresponding passband, a decrease in the attenuation, i.e., an increase in the level of signals being passed, due to the rebound of an attenuation pole is prevented and high attenuation is achieved over a wide frequency range.

Note that, in this case, since the shape of each balun is changed due to the shifting of the characteristics of the balun, the impedance of the balun may change, which results in an impedance mismatch with the triplexer 13 and an increase in the insertion loss of the balun. However, balancing and impedance matching between the baluns and the triplexer 13 can be performed by appropriately adjusting the capacitance of the capacitors C1, C10, and C13 respectively connected to the baluns 321, 322, and 323 in the triplexer 13. Thereby, the attenuation characteristics of the passbands in the high-frequency module can be improved without increasing the insertion loss of the baluns.

Specifically, referring to FIG. 4, for the first communication signal in a passband BT2G, there is a rebound band in which the attenuation decreases to about −15 dB primarily in a frequency range between about 0.5 GHz and about 1.5 GHz for an attenuation pole at about 1.9 GHz, with only the triplexer 13. However, by providing the shifted transmission characteristics of the balun 321, the attenuation is improved to about −30 dB or greater.

Referring to FIG. 5, for the third communication signal in a passband BT3G, there is a rebound band in which the attenuation decreases to about −15 dB primarily in a frequency range between about 0.5 GHz and about 2.2 GHz for an attenuation pole at about 2.7 GHz, with only the triplexer 13. However, by providing the shifted transmission characteristics of the balun 322, the attenuation is improved to about −30 dB or greater.

Referring to FIG. 6, for the second communication signal in a passband BT5G, there is a rebound band in which the attenuation decreases to about −10 dB primarily in a frequency range between about 2.0 GHz and about 3.6 GHz for an attenuation pole at about 3.8 GHz, with only the triplexer 13. However, by providing the shifted transmission characteristics of the balun 323, the attenuation is improved to about −20 dB or greater.

As described above, the circuit configuration of the present preferred embodiment provides a high-frequency module which enables attenuation outside of the passbands to be increased over wide frequency ranges without decreasing the levels of signals passed through the passbands. In this case, since additional filters need not be individually inserted to obtain the attenuation in the rebound bands, a small high-frequency module having a simplified structure and the above-described outstanding characteristics is obtained.

Figure 7:
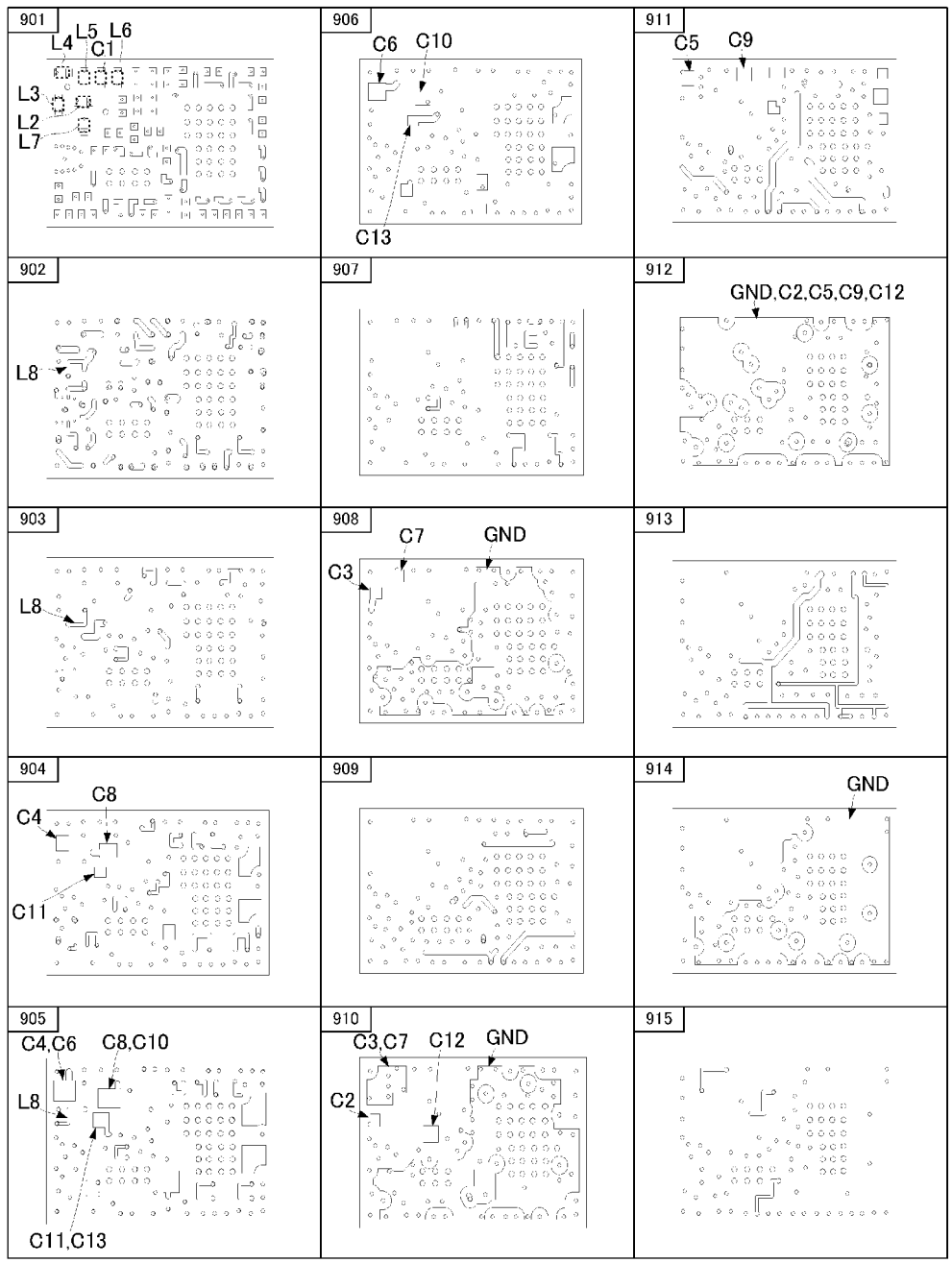
FIG. 7 is a stacking diagram illustrating the configuration of each layer of a communication module according to a preferred embodiment of the present invention.
Figure 8:
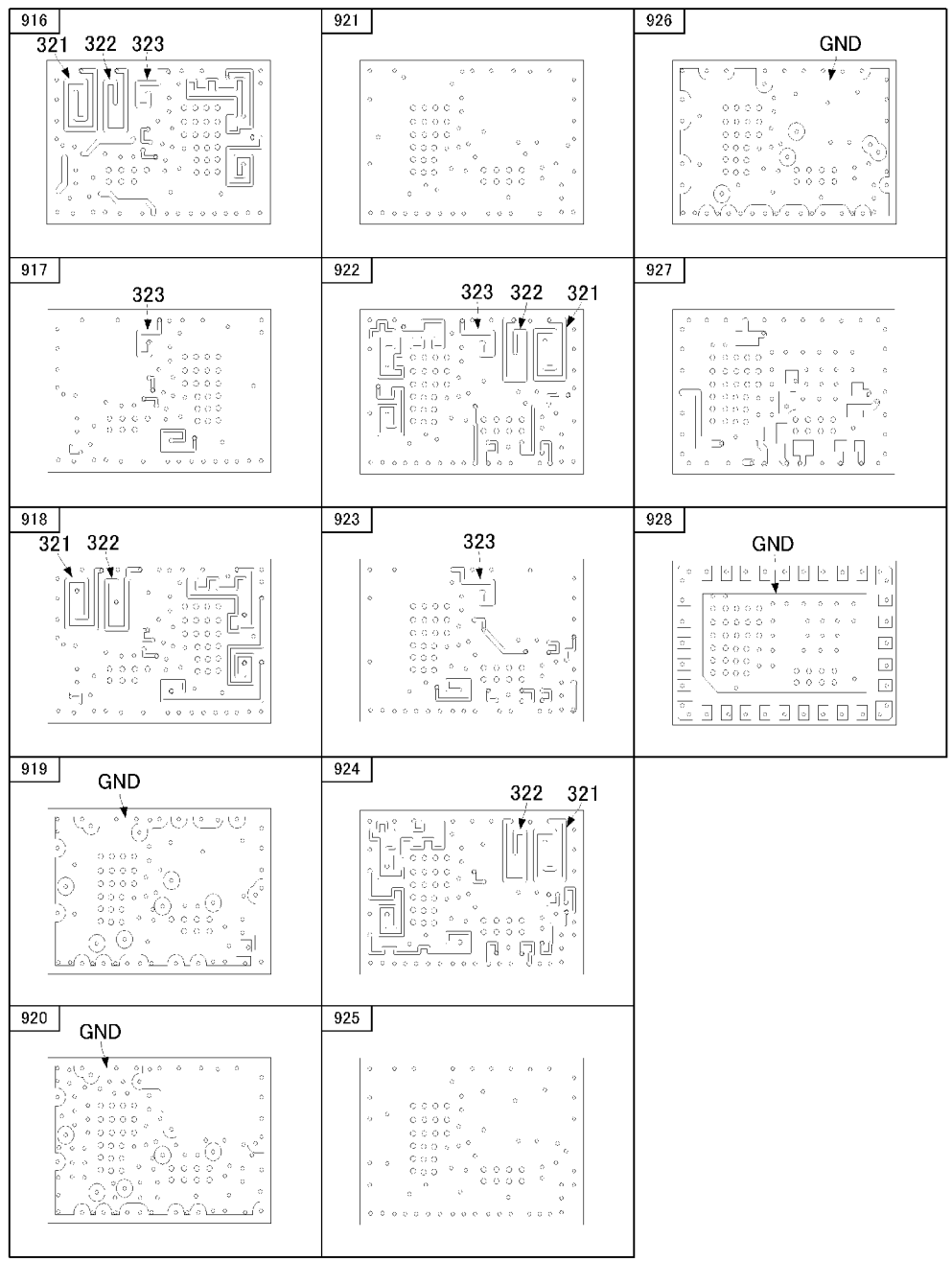
FIG. 8 is a stacking diagram illustrating the configuration of each layer of a communication module according to a preferred embodiment of the present invention.

Referring to FIGS. 7 and 8, a plurality of stacked dielectric layers of the high-frequency module described above and a configuration to mount circuit components on the plurality of stacked dielectric layers will now be described. FIG. 7 and are stacking diagrams illustrating the configuration of each layer of the communication module 10 including a high-frequency module. Note that FIG. 7 illustrates dielectric layers from a dielectric layer 901, which is the uppermost layer of the stack, to a dielectric layer 915, which is the 15th layer of the stack, and FIG. 8 illustrates dielectric layers from a dielectric layer 916, which is the 16th layer of the stack, to a dielectric layer 928, which is the lowermost layer of the stack. In FIGS. 7 and 8, dielectric layers from the dielectric layer 901, which is the uppermost layer, to a dielectric layer 918, which the 18th layer, are illustrated as plan views viewed from the top surface side, and in FIG. 8, dielectric layers from a dielectric layer 919, which is the 19th layer, to the dielectric layer 928, which is the lowermost layer, are illustrated as plan views viewed from the bottom surface side. In FIGS. 7 and 8, only the portions related to the high-frequency module, i.e., the triplexer 13 and the baluns 321, 322, and 323, are described. Note that the small circles shown on the dielectric layers illustrated in FIGS. 7 and 8 are conductive via holes that electrically connect the inner layer electrode patterns of the layers to one another in the stacking direction.

Mounting lands arranged in predetermined patterns to mount mounting-type circuit components are preferably provided on the surface of the dielectric layer 901, which is the uppermost layer, that is, on the top surface of the stack. The inductors L2, L3, L4, and L5 and the capacitor C1 of the BPF 312, the inductor L6 of the HPF 313, and the inductor L7 of the HPF 314 are mounted on the mounting lands.

The inductor L8 of the LPF 311 is provided on the dielectric layers 902, 903, and 905 and includes line electrode patterns.

The dielectric layer 904 preferably includes plate-shaped first opposing electrodes of the capacitor C4 of the BPF 312, the capacitor C8 of the HPF 313, and the capacitor C11 of the HPF 314 provided thereon.

The dielectric layer 905 preferably includes second opposing electrodes of the capacitors C4, C8, and C11 provided thereon. The second opposing electrode of the capacitor C4 on the dielectric layer 905 defines a first opposing electrode of the capacitor C6 of the BPF 312. The second opposing electrode of the capacitor C8 on the dielectric layer 905 defines a first opposing electrode of the capacitor C10 of the HPF 313. The second opposing electrode of the capacitor C11 on the dielectric layer 905 defines a first opposing electrode of the capacitor C13 of the HPF 314.

The dielectric layer 906 preferably includes second opposing electrodes of the capacitors C6, C10, and C13 provided thereon.

The dielectric layer 908 preferably includes first opposing electrodes of the capacitors C3 and C7 of the BPF 312, and a ground electrode GND provided thereon.

The common second opposing electrode of the capacitors C3 and C7 is preferably provided on the dielectric layer 910. Further, the dielectric layer 910 includes first opposing electrodes of the capacitor C2 of the LPF 311 and the capacitor C12 of the HPF 314 provided thereon.

The dielectric layer 911 preferably includes first opposing electrodes of the capacitor C5 of the BPF 312 and the capacitor C9 of the HPF 313 provided thereon.

The dielectric layer 912 preferably includes a ground electrode GND provided on substantially the entire layer thereof. The ground electrode GND functions as the second opposing electrode of the capacitors C2, C5, C9, and C12. The dielectric layer 914 includes a ground electrode GND provided thereon.

The dielectric layer 916 preferably includes line electrodes provided thereon, the line electrodes defining the baluns 321, 322, and 323. The dielectric layer 917 preferably includes a line electrode provided thereon, the line electrode defining the balun 323. The dielectric layer 918 preferably includes line electrodes provided thereon, the line electrodes defining the baluns 321 and 322. The baluns 321, 322, and 323 defined by the line electrodes on the dielectric layers 916, 917, and 918 respectively preferably have substantially spiral shapes that are wound in predetermined directions. The baluns 321, 322, and 323 defined by the dielectric layers 916, 917, and 918 are the unbalanced side lines 321$u$, 322$u$, and 323$u$.

Here, the baluns 321 and 322, and the balun 323 are preferably arranged so as to have opposite winding directions. Thereby, coupling between the baluns 321 and 322 and the balun 323 is prevented.

Further, the baluns 321 and 322, and the balun 323 are preferably at least partially disposed on different layers. More specifically, the baluns 321 and 322 are disposed on the dielectric layers 916 and 918, and the balun 323 is disposed on the dielectric layers 916 and 917. By arranging the two groups of baluns at least partially on different layers as described above, coupling between the baluns 321 and 322, and the balun 323 is prevented.

The balun 322 is preferably arranged between the balun 321 and the balun 323 in plan view. Thereby, coupling between the balun 321 and the balun 323 is prevented.

By arranging the baluns 321, 322, and 323 as described above, coupling among the baluns are effectively prevented. In particular, coupling between the balun 321 and the balun 323 is more effectively prevented. Here, for example, the balun 321 is for the first communication signal in a 2 GHz band and the balun 323 is for the second communication signal in a 5 GHz band. Thus, the first and second communication signals have a relationship in which the frequencies of their harmonics are superposed with each other. Accordingly, mutual interference between the first and second communication signals may cause problems. However, with the configuration described above, such mutual interference is prevented. Thereby, a high-frequency module having significantly improved passband and attenuation characteristics is achieved.

A ground electrode GND is preferably provided on substantially the entire dielectric layer 919. A ground electrode GND is also preferably provided on the dielectric layer 920.

The dielectric layer 922 preferably includes line electrodes provided thereon, the line electrodes defining the baluns 321, 322, and 323. The dielectric layer 923 preferably includes a line electrode provided thereon, the line electrode defining the balun 323. The dielectric layer 924 preferably includes line electrodes provided thereon, the line electrodes defining the baluns 321 and 322. In the baluns 321, 322, and 323 defined by the line electrodes on the dielectric layers 922, 923, and 924, the baluns 321 and 322 are preferably arranged to have different winding directions from the winding direction of the balun 323, similarly to the dielectric layers 916, 917, and 918. The baluns 321, 322, and 323 provided on dielectric layers 922, 923, and 924 are the balanced side lines 321$p$, 321$n$, 322$p$, 322$n$, 323$p$, and 323$n$. The operation and effect of the configuration of the dielectric layers 916, 917, and 918 are similarly achieved in the dielectric layers 922, 923, and 924.

The dielectric layer 926 preferably includes a ground electrode GND provided on substantially the entire layer.

The dielectric layer 928, which is the lowermost layer of the stack, preferably includes various external connection electrodes and a ground electrode GND provided thereon in predetermined patterns.

Thus, with the configuration of the present preferred embodiment, a high-frequency module and a communication module that includes a small stack of dielectric layers are provided in which deterioration in transmission characteristics is prevented, attenuation characteristics in a range outside of a passband are improved, and deterioration in characteristics due to coupling among baluns is prevented.

Note that, in the preferred embodiment described above, although a triplexer has been described as an example, the configuration described above may preferably be applied to other high-frequency modules which allow communication signals in desired frequency bands to pass using filters.

Further, in the preferred embodiment described above, although improved attenuation on the lower frequency side of the passband of a triplexer has been described as an example, preferred embodiments of the present invention may be similarly applied to the higher frequency side. However, as illustrated in FIG. 3, on the higher frequency side, a passband appears at a frequency which is the center frequency of the passband of a balun multiplied by an odd number. Thus, to improve the attenuation on the higher frequency side, it may be necessary to change, for example, the center frequency of the passband of the balun.

Setting the attenuation to −3 dB or greater at the frequency of an attenuation pole, as described above, is a specific example of setting the transmission characteristics of a balun. Thus, to obtain the operation and effect of the present preferred embodiment, it is only necessary for the passbands of a triplexer and the balun to be superposed with each other, and the transmission characteristics of a balun to be set such that the attenuation of the balun is high in a frequency range opposite the passband with respect to an attenuation pole of the triplexer in proximity of the passband.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a frequency selector provided on an unbalanced side and arranged to allow predetermined frequency bands of communication signals to pass therethrough, the frequency selector including a plurality of filter circuits, a plurality of first input-output terminals defining individual input-output terminals for communication signals having different frequency bands, and a second input-output terminal defining a common terminal; and
a plurality of balun units respectively arranged for the individual input-output terminals to perform balanced to unbalanced conversion, the plurality of balun units being respectively connected to the individual input-output terminals of the frequency selector on the unbalanced side, and the plurality of balun units having passbands and attenuation characteristics for attenuation corresponding to the respective individual input-output terminals to which the plurality of balun units are connected; wherein
each of the plurality of filter circuits of the frequency selector includes an attenuation pole in proximity of one of the predetermined frequency bands of the communication signals;
in each of the plurality of balun units, a passband of the respective balun unit includes the predetermined frequency band of one of the communication signals, and attenuation for the one of the communication signals in a frequency range on a side opposite to the predetermined frequency band of the one of the communication signals with respect to the attenuation pole increases as a frequency decreases from a frequency of the attenuation pole;

each of the plurality of filter circuits of the frequency selector includes a first capacitor and a series circuit including an inductor and a second capacitor;

the first capacitor connects one of the plurality of balun units to the respective one of the plurality of filter circuits;

the first capacitor is configured to match an impedance between the one of the plurality of balun units and the frequency selector;

the first capacitor is connected to ground through the series circuit;

at least one of the plurality of filter circuits is a low pass filter including a second inductor connected between the series circuit and the common terminal; and at least one of the plurality of filter circuits is a high pass filter including a third capacitor connected between the series circuit and the common terminal.

2. The high-frequency module according to claim 1, wherein the frequency selector is a triplexer arranged to demultiplex three types of communication signal having different frequency bands input from the common terminal.

3. The high-frequency module according to claim 2, wherein the triplexer includes inner layer electrode patterns provided on a plurality of stacked dielectric layers and/or circuit components mounted on a top surface of the plurality of stacked dielectric layers;

a first balun corresponding to a first communication signal having the highest frequency band among the three types of communication signals, a second balun corresponding to a second communication signal having the lowest frequency band among the three types of communication signals, and a third balun corresponding to a third communication signal having an intermediate frequency band that is between the frequency band of the first communication signal and the frequency band of the second communication signal are defined by the inner layer electrode patterns; and the inner layer electrode pattern of the first balun and the inner layer electrode pattern of the second balun are at least partially disposed on different layers of the plurality of stacked dielectric layers.

4. The high-frequency module according to claim 3, wherein the inner electrode pattern of the third balun is arranged between the inner electrode pattern of the first balun and the inner electrode pattern of the second balun, on the same layer of the plurality of stacked dielectric layers.

5. The high-frequency module according to claim 3, wherein the inner electrode pattern of the first balun and the inner electrode pattern of the second balun have substantially the same spiral shapes which have winding directions that are opposite to each other.

6. The high-frequency module according to claim 2, wherein each of the first, second, and third baluns includes an unbalanced side line having a length of about ½ of a wavelength of the corresponding communication signal and two balanced side lines having a length of about ¼ of the wavelength of the corresponding communication signal; and characteristics of each of the first, second, and third baluns are set to correspond to an attenuation pole that appears in a frequency range lower than the corresponding passband of the frequency selector.

7. The high-frequency module according to claim 2, wherein the frequency band of the first communication signal is a 2 GHz band, and the frequency band of the second communication signal is a 5 GHz band.

8. The high-frequency module according to claim 1, wherein in each of the plurality of balun units, attenuation at the attenuation pole is increased to about −3 dB relative to attenuation in a frequency band of the one of the communication signals.

9. The high-frequency module according to claim 1, wherein:

at least one of the plurality of filter circuits is a band pass filter including a third inductor, a fourth capacitor, and a second series circuit including a fourth inductor and a fifth capacitor connected to ground;

the fourth capacitor is connected between the series circuit and the second series circuit; and the third inductor is connected between the second series circuit and the common terminal.

* * * * *